United States Patent
Krippner et al.

(10) Patent No.: US 10,935,019 B2
(45) Date of Patent: Mar. 2, 2021

(54) FILM TRANSDUCER, PUMP AND METHOD FOR OPERATING A PUMP

(71) Applicant: Buerkert Werke GmbH & Co. KG, Ingelfingen (DE)

(72) Inventors: Peter Krippner, Ingelfingen (DE); Michael Schupp, Ingelfingen (DE)

(73) Assignee: BUERKERT WERKE GMBH & CO. KG

( * ) Notice: Subject to any disclaimer, the term of this patent is extended or adjusted under 35 U.S.C. 154(b) by 81 days.

(21) Appl. No.: 16/219,045

(22) Filed: Dec. 13, 2018

(65) Prior Publication Data

US 2019/0186482 A1 Jun. 20, 2019

(30) Foreign Application Priority Data

Dec. 15, 2017 (DE) .................. 10 2017 130 199

(51) Int. Cl.
  *H01L 41/193* (2006.01)
  *F04B 43/04* (2006.01)
  *F04B 17/03* (2006.01)

(52) U.S. Cl.
  CPC .............. *F04B 43/04* (2013.01); *F04B 17/03* (2013.01); *H01L 41/193* (2013.01)

(58) Field of Classification Search
  CPC .................................. F04B 43/04; F04B 17/03
  See application file for complete search history.

(56) References Cited

U.S. PATENT DOCUMENTS

| | | | |
|---|---|---|---|
| 2001/0035723 A1 | 11/2001 | Pelrine et al. | |
| 2004/0008853 A1* | 1/2004 | Pelrine ............... | F04B 43/09 381/191 |
| 2004/0124738 A1 | 7/2004 | Pelrine et al. | |
| 2015/0000423 A1* | 1/2015 | Dunn ................ | F04B 43/04 73/861.47 |
| 2016/0091099 A1 | 3/2016 | Scheibe et al. | |

FOREIGN PATENT DOCUMENTS

| | | | |
|---|---|---|---|
| DE | 102009055375 A1 | 6/2011 | |
| DE | 102014114212 A1 | 3/2016 | |
| DE | 102018110725 A1 * | 11/2019 | ............. F04B 43/04 |

* cited by examiner

*Primary Examiner* — J. San Martin
(74) *Attorney, Agent, or Firm* — Dilworth IP, LLC (57) ABSTRACT

A film transducer for a pump is described, comprising at least one holding part arranged fixed, a displaceable switch unit and at least two electroactive composite film units which each have at least two electrodes. The electroactive composite film units are each assigned to the holding part and the switch unit. The electroactive composite film units have an actuation direction in which the electroactive composite film units lengthen when actuated, wherein the actuation direction lies in a plane spanned by the electroactive composite film units. Furthermore, a pump and a method for operating a pump are described.

12 Claims, 4 Drawing Sheets

FILM TRANSDUCER, PUMP AND METHOD FOR OPERATING A PUMP

The invention relates to a film transducer for a pump, a pump and a method for operating a pump.

From the state of the art, valves are known which comprise actuators for displacing a valve element, with an electroactive polymer (EAP) which converts an electrical energy into a mechanical movement. Actuators of this type are also referred to as EAP actuators.

EAP actuators are usually formed as stack actuators, which are used in the case of relatively large valves as the stack actuator has a corresponding volume due to its required depth.

In addition, valves are known which have an EAP actuator formed as a film transducer, via which electrical energy is correspondingly converted into mechanical work. The difference from a stack actuator is that, in the case of a film transducer the actuator mostly consists of only one film made of an electroactive polymer material with the result that in a first operating state (usually the initial state) it has a small volume. For example, such a film transducer is known from DE 10 2016 114 531 A1, in which an electrical actuation of the electroactive composite film structure (also called composite film unit) leads to a movement out of the plane spanned by the electrical composite film structure. In this respect, the EAP actuator formed as a film transducer also requires a relatively large volume during the operation, thus during the transition between the non-activated and the activated operating state.

In the case of the known valves with an EAP actuator which converts the electrical energy into the mechanical movement there is thus a large space requirement in each case.

This applies analogously to the pumps known from the state of the art in which EAP actuators are used, via which the pumping function is provided.

The object of the invention is to provide an energy-efficient actuator for a narrow pump as well as a correspondingly energy-efficient pump. Furthermore, it is an object of the invention to provide a way in which a medium, for example a fluid, can be conveyed in an energy-efficient manner.

The object is achieved according to the invention by a film transducer for a pump, which comprises at least one holding part arranged fixed, a displaceable switch unit and at least two electroactive composite film units, which each have at least two electrodes, wherein the electroactive composite film units are each assigned to the holding part and the switch unit, and wherein the electroactive composite film units have an actuation direction in which the electroactive composite film units lengthen when actuated, wherein the actuation direction lies in a plane spanned by the electroactive composite film units, wherein in each case one end of the electroactive composite film units is coupled to the switch unit, which does not have a fixed bearing point, and wherein a controller is provided which is configured to actuate the electroactive composite film units separately and independently of each other.

The basic concept of the invention is to form the film transducer, which can serve as an actuator for a pump, such that the actuation direction lies in the plane spanned by the electroactive composite film units, whereby a narrow actuator is created which remains correspondingly narrow in all operating states. This is due to there being a so-called "in-plane" movement direction of the film transducer which is perpendicular to the "out-of-plane" actuators usually known from the state of the art, which require a correspondingly larger volume during operation of the film transducer. For example, the electroactive composite film units each extend spatially in a plane which is spanned in the case of a Cartesian co-ordinate system in the x direction and in the y direction, wherein the depth of the electroactive composite film units in the z direction, i.e. the thickness, is to be disregarded since the electroactive composite film units can each be formed by at least one film made of an electroactive polymer.

In general, the electroactive composite film unit of the film transducer according to the invention lengthens in the spanned plane, for example in the x direction or the y direction if an electrical voltage is applied to the electroactive composite film unit. The switch unit assigned to the electroactive composite film units can thereby be correspondingly displaced in the actuation direction in which the film transducer has expanded, in particular the correspondingly actuated electroactive composite film unit. In the above-named example, the actuation direction is the y direction. When actuated, the film transducer, in particular the correspondingly actuated electroactive composite film unit, therefore moves in the plane which is spanned by the film transducer itself, whereby the volume of the film transducer changes only slightly. In contrast to the film transducer according to the invention with the "in-plane" actuation direction, the volume of the film transducer taken up by the film transducer with "out-of-plane" actuation direction would change greatly when actuated, for example the volume of a cuboid surrounding the film transducer.

The electroactive composite film units each consist, for example, of a (single) film made of an electroactive polymer.

In general, the electroactive composite film units can comprise several films made of an electroactive polymer.

Furthermore, the electroactive composite film unit can comprise a flexible frame, which surrounds the electroactive polymer material in order to protect it correspondingly.

Alternatively, the frame which surrounds the electroactive polymer material can be fixed.

In general, the film transducer can be used as a strip actuator, for example as a strip actuator of a valve or as a strip actuator of a pump.

Due to the at least two electroactive composite film units, the film transducer has a correspondingly high flexibility, with the result that several switch positions are possible.

Since the switch unit has no fixed bearing point, as is usual in the case of a rocker switch, and the electroactive composite film units each have their own electrodes which are assigned to corresponding electrical contacts, a voltage can be applied to the electroactive composite film units independently of each other in order to realize the different switch positions of the film transducer. The controller thus actuates the electrical contacts assigned to the composite film units in each case or applies a voltage to them, in order to actuate the electroactive composite film units individually.

The switch unit is formed substantially inherently rigid.

Both electroactive composite film units are coupled directly to the switch unit, wherein the switch unit is displaced via the electroactive composite film units in order thus to set the different switch positions of the film transducer.

One aspect provides that the electroactive composite film units displace the switch unit both in a linear direction and also rotationally. If both composite film units are operated simultaneously, the switch unit can be displaced linearly, whereas a rotation of the switch unit about a (virtual) axis of rotation is possible if only one of the two composite film units is actuated. The axis of rotation is virtual as it is not a fixed bearing axis, as is provided in the case of conventional rocker switches.

In this respect, the switch unit has no fixed axis of rotation. The switch unit is therefore formed without an axis of rotation.

In particular, the switch unit comprises a base body, which is formed in one piece. This means that both electroactive composite film units are coupled directly to the same base body of the switch unit formed in one piece.

One aspect provides that the electrodes are arranged on opposite sides of the respective electroactive composite film unit, in particular wherein the electrodes extend over the entire surface of the respective side. If a voltage which is present between the two electrodes is applied to the film transducer, in particular the respective electroactive composite film unit, a corresponding attractive force forms between the two electrodes due to the electrical field produced, whereby the electrodes try to reduce the distance from each other. Thereupon, the electroactive polymer material lying between the electrodes is compressed, whereby, in particular due to the incompressibility of the material, the electroactive composite film unit lengthens in the correspondingly spanned plane (e.g. in the x and y directions) which is perpendicular to the thickness (z direction) of the film transducer, which corresponds to the distance between the two electrodes.

A further aspect provides that the film transducer, in particular each electroactive composite film unit, has a direction of main extent which coincides with the actuation direction. In this respect, the film transducer or the electroactive composite film units can have a substantially rectangular shape, wherein the film transducer or the respective electroactive composite film unit extends more in one direction than in another, whereby the direction of main extent is defined. When actuated, the electroactive composite film units in each case lengthen correspondingly in this direction of main extent. The direction of main extent therefore corresponds to the direction of the film transducer which has substantially the longest extension, in particular wherein the direction of main extent runs through centre points on opposite edges or ends of the respective electroactive composite film unit. It is therefore not a diagonal in the correspondingly spanned plane.

In addition to the substantially rectangular shape of the film transducer, in particular of the respective electroactive composite film unit, other geometries can be provided, for example a triangular shape. However, these geometries are likewise formed such that a direction of main extent likewise results for the film transducer or the respective electroactive composite film unit.

According to an embodiment, in each case a first end of the electroactive composite film unit is held, in particular clamped, on the holding part and/or in each case a second end of the electroactive composite film unit, opposite the first end, is coupled, in particular clamped, to the switch unit. In this respect, the holding part and the switch unit can in each case comprise a clamping point at which the at least two electroactive composite film units are mechanically clamped. The two composite film units thus extend from the clamping point provided on the holding part to the clamping point of the switch unit, in particular wherein this represents the direction of main extent.

According to a further aspect, the film transducer has electrical contacts for the electrical contacting of the electrodes. The electrical contacts are arranged, for example, on the holding part with the result that the respective electroactive composite film units are contacted on the holding part. This results in a simple structure of the film transducer since the holding part, in contrast to the displaceable switch unit, is arranged stationary. The electrical lines to the electrical contacts are thus easier to realize.

In general, the controller can be part of the film transducer or be formed by a higher-level controller of a higher-level assembly which comprises the film transducer, for example the higher-level controller of a valve or of a pump.

The switch unit can comprise at least one membrane. The membrane is a flexible membrane which is displaced when the film transducer is actuated. The membrane can also be used for the separation of media.

The membrane is thus formed flexible in comparison with the remainder of the switch unit, i.e. the base body, for which reason the entire switch unit is formed substantially inherently rigid. Only the area of the switch unit assigned to the pump connections, which is provided with the membrane, can be formed flexible at least in sections in order to improve the sealing function.

If the switch unit comprises a membrane and a base body coupled to the membrane, the membrane can be displaced in sections via the base body coupled to the membrane. Here, the base body provides the clamping points for the electroactive composite film units with the result that the electroactive composite film units firstly actuate the base body directly, wherein the movement of the base body is then transferred to the membrane with the result that at least one section of the membrane is displaced. The section of the membrane thus corresponds to a section of the switch unit, which can in each case be regarded as valve elements, which are assigned to corresponding valve seats.

A further aspect provides that at least one spring co-operates with the switch unit in order to mechanically preload the electroactive composite film units, in particular two springs which engage opposite ends of the switch unit in relation to the electroactive composite film units. The mechanical preloading of the electroactive composite film units is necessary in order to guarantee the function of the film transducer, in particular the function of the electroactive composite film units. If two springs are provided, which engage opposite ends of the switch unit, a homogeneous preloading of the electroactive composite film units is guaranteed.

Alternatively, one spring can be provided, which extends, for example, centrally between the two electroactive composite film units from the holding part to the switch unit, in order to correspondingly preload the film transducer.

The at least one spring is part of a spring system which is coupled directly to the switch unit.

The switch unit is only held or mounted via the at least two electroactive composite film units and the spring system comprising at least one spring. In this respect, the switch unit has no fixed bearing point which defines, for example, an axis of rotation.

In principle, the switch unit can thus be acted on by the controller in four positions since the two electroactive composite film units can be brought into two different positions independently of each other. The four positions can be set via a linear movement of the switch unit as well as a rotational movement of the switch unit about a (virtual) axis of rotation.

Furthermore, the object is achieved according to the invention by a valve with a valve housing, which comprises at least two connections, and a strip actuator, which is formed as a film transducer of the type named above. The advantages named above result analogously for the valve. In particular, this results in a valve formed particularly narrow, which has a very small thickness. The thickness corresponds to the direction which is perpendicular to the spanned plane of the electroactive composite film units.

In addition, the object is achieved according to the invention by a pump with a pump housing which comprises at least two connections, and a strip actuator, which is formed as a film transducer of the type named above, in particular wherein the pump is formed as a rocker pump. The advantages named above with respect to the film transducer result analogously for the pump. In particular, this results in a pump formed particularly narrow, which has a very small thickness. The thickness corresponds to the direction which is perpendicular to the spanned plane of the electroactive composite film units.

The strip actuator can comprise precisely two composite film units which are arranged next to each other.

Furthermore, the object is achieved according to the invention by a method for operating a pump, in particular a pump of the type named above, with the following steps:
  actuating a first electroactive composite film unit of the pump in a suction step such that a movement of a first section of a switch unit out of its actuated position into a suction position is effected,
  actuating a second electroactive composite film unit of the pump in a first pumping step such that a movement of a second section of the switch unit out of its actuated position into a pumping position is effected,
  actuating the first electroactive composite film unit in a second pumping step such that the first section of the switch unit returns to its actuated position, and
  actuating the second electroactive composite film unit in an ejecting step such that the second section of the switch unit returns to its actuated position.

With the method according to the invention it is thus possible to convey a fluid in an efficient manner via a corresponding pump. The pumps used here are pumps formed narrow such that many pumps can be used next to each other in a small space. This is in particular due to a film transducer of the type named above being used as a strip actuator which comprises the first electroactive composite film unit and the second electroactive composite film unit.

In principle, the film transducer or the pump can therefore assume a position in which all the connections are closed or released. This is possible due to the linear movement of the switch unit.

The film transducer or the pump can also assume a position in which one connection is closed and another connection is released, or vice versa. This is possible due to the rotational movement of the switch unit (about the virtual axis of rotation).

Further advantages and properties of the invention result from the following description and the drawings, to which reference is made. There are shown in the drawings.

Figure 1:
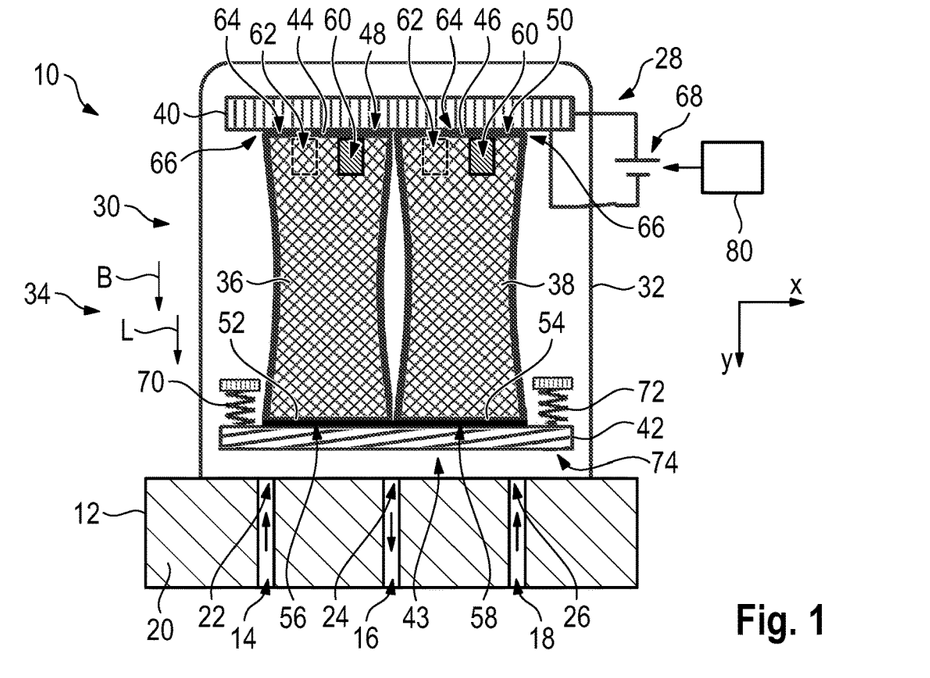
FIG. 1 a valve in an open, non-actuated position with a film transducer according to the invention in a schematic manner, FIG. 2 a sectional representation of the valve from FIG. 1 in the closed, actuated position, FIG. 3 a sectional representation of the valve from FIGS. 1 and 2 in a first switch position, FIG. 4 a sectional representation of the valve from FIGS. 1 to 3 in a second switch position, FIG. 5 a sectional representation of a pump according to the invention in a suction step with a film transducer according to the invention in a schematic manner, FIG. 6 a sectional representation of the pump according to the invention from FIG. 5 in a first pumping step, FIG. 7 a sectional representation of the pump according to the invention from FIGS. 5 and 6 in a second pumping step, FIG. 8 a sectional representation of the pump according to the invention from FIGS. 5 to 7 in a third pumping step.

In FIG. 1, a valve 10 is shown which is formed as a "normally open" valve (NO valve), which is therefore in its open position if it is not actuated, as represented.

Alternatively, however, the valve 10 can also be formed as a "normally closed" valve (NC valve), which is in its closed position if it is not actuated.

In the embodiment shown, the valve 10 comprises a valve housing 12 with a first fluid connection 14, a second fluid connection 16 and a third fluid connection 18. The corresponding fluid connections 14-18 are arranged in a valve body 20, wherein the fluid connections 14-18 are each assigned a valve seat 22-26.

In addition, the valve 10 comprises a strip actuator 28, which is formed by a film transducer 30.

The strip actuator 28 comprises an actuator housing 32, which is coupled to the valve housing 12, in order together to form a valve housing 34 of the valve 10.

In the embodiment shown, the film transducer 30 which forms the strip actuator 28 comprises a first electroactive composite film unit 36 as well as a second electroactive composite film unit 38, which are each formed by at least one film made of an electroactive polymer (and at least two electrodes), for which reason the corresponding film can also be referred to as an electroactive polymer film.

The film transducer 30 additionally comprises a holding part 40 arranged stationary as well as a displaceable switch unit 42, which is correspondingly movable. The stationary holding part 40 can be coupled to the actuator housing 32 or the holding part 40 and the actuator housing 32 are formed in one piece with each other.

In contrast, in the embodiment shown, the displaceable switch unit 42 forms a valve element which co-operates with at least one of the valve seats 22-26 in order to correspondingly release or close this at least one valve seat 22-26.

The switch unit 42 acting as valve element is assigned to a collection chamber 43 of the valve 10 which is provided between the valve element or the switch unit 42 and the valve seats 22-26 when the switch unit 42 is located in its non-actuated or open position, as represented in FIG. 1. In the collection chamber 43, a fluid can collect which can discharge correspondingly via one of the fluid connections 14-18 when the switch unit 42 is located in a corresponding position, i.e. the open position, in which the switch unit 42 serving as valve element is not supported on the assigned valve seat 22-26.

Alternatively, the switch unit 42 serving as valve element can close or release the inflow into the collection chamber 43 depending on its position in that the switch unit 42 is pushed onto the corresponding valve seat 22-26, or not.

In this respect, the first fluid connection 14 can serve as inlet or outlet. The second fluid connection 16 or the third fluid connection 18 can likewise function as an outlet or inlet.

In order to move the switch unit 42 serving as valve element into its respective switch position the movable switch unit 42 and the stationary holding part 40 are each coupled to the two electroactive composite film units 36, 38. The electroactive composite film units 36, 38 convert a voltage signal into a movement such that the switch unit 42 moves correspondingly, as is to be explained below with reference to the functioning of the valve 10, in particular of the switch unit 42 serving as valve element.

For this purpose, the switch unit 42 is formed substantially inherently rigid such that it can be moved due to the actuation of the electroactive composite film units 36, 38.

The two electroactive composite film units 36, 38 each have a first end 44, 46 which is clamped to the holding part 40 at a corresponding clamping point 48, 50.

In addition, the two electroactive composite film units 36, 38 comprise a second end 52, 54, opposite the first end 44, 46 respectively, via which the two electroactive composite film units 36, 38 are respectively clamped to the displaceable switch unit 42 at a corresponding clamping point 56, 58.

In this respect, the electroactive composite film units 36, 38 are each mechanically held, in particular clamped, to the respective clamping points 48, 50, 56, 58 via the corresponding clamping points 48, 50, 56, 58,.

In other words, the electroactive composite film units 36, 38 are each coupled directly to the holding part 40 and to the switch unit 42.

It further follows from FIG. 1 that the electroactive composite film units 36, 38 each have at least two electrodes 60, 62 which are formed on opposite sides of the electroactive composite film units 36, 38, i.e. on opposite sides of the corresponding film of the respective electroactive composite film unit 36, 38, as follows from the second electrode 62 represented by a dashed line.

For reasons of clarity, the at least two electrodes 60, 62 are only partially represented in the present case, wherein they can extend over the entire surface of the respective side of the respective electroactive composite film unit 36, 38 such that the electroactive polymer material of the electroactive composite film units 36, 38 is arranged between the two electrodes 60, 62.

An edge area can also be provided which surrounds the at least two electrodes 60, 62. This edge area serves as electrical insulation area in order to prevent electrical arcing in the area of the edges.

The at least two electrodes 60, 62 are thus arranged in the z direction (lying one above the other), i.e. the direction perpendicular to the drawing plane represented. The z direction corresponds to the thickness of the film transducer 30, in particular of the electroactive composite film units 36, 38, which is generally to be disregarded. Here, the electrodes 60, 62 extend in the x and y direction, i.e. the plane E spanned in each case.

Both electrodes 60, 62 are assigned here to at least the first end 44, 46 of the corresponding electroactive composite film unit 36, 38 such that the electrodes 60, 62 can in each case be contacted electrically via electrical contacts 64, 66 provided on the holding part 40.

Here, the electrical contacts 64, 66 are connected to a voltage source 68 in order to apply a voltage to the respective electroactive composite film units 36, 38 in order to actuate the electroactive composite film units 36, 38, as is to be explained below.

In addition, in the embodiment shown, the film transducer comprises two springs 70, 72 which are assigned to the switch unit 42. The two springs 70, 72 engage opposite ends of the displaceable switch unit 42 with one end in each case. With the other ends the springs 70, 72 are supported on a corresponding bearing section. The other ends of the springs 70, 72 are in each case mounted stationary on the actuator housing 32 or the valve housing 34, for example.

The springs 70, 72 thus represent a spring system via which the switch unit 42 is held movably, among other things.

Figure 2:
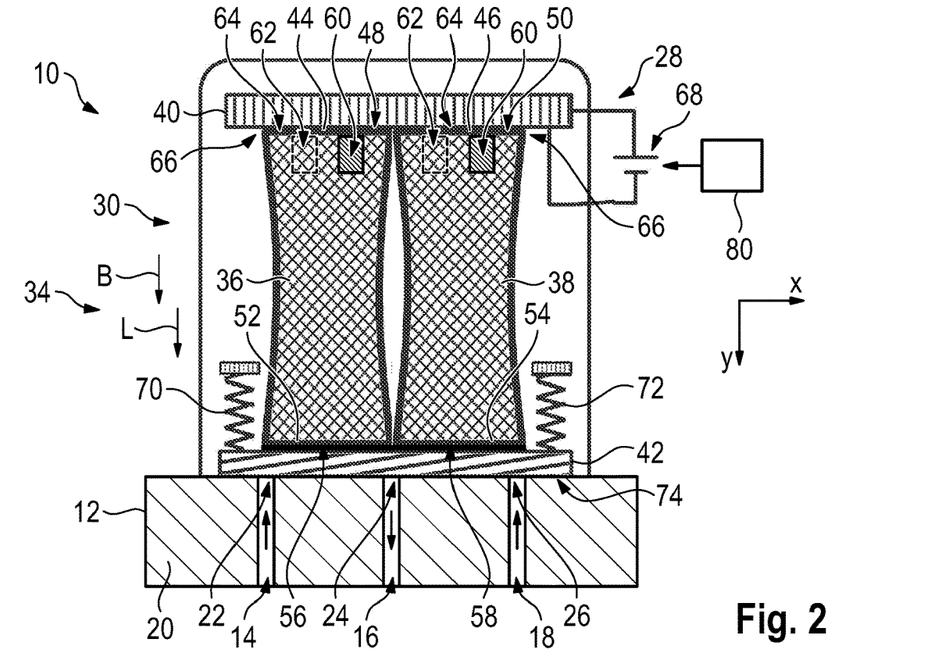

Via the springs 70, 72, a mechanical preloading of the electroactive composite film units 36, 38 is achieved, wherein the displaceable switch unit 42 is acted on by the springs 70, 72 in the direction of the closed position, which is shown in FIG. 2. The springs 70, 72 are therefore compression springs. The spring force of the springs 70, 72 consequently stretches the two electroactive composite film units 36, 38 in the y direction, as follows from FIG. 1.

Since the two springs 70, 72 are arranged at opposite ends (and on the same side) of the displaceable switch unit 42, the springs 70, 72 exert a substantially homogeneous force. Tilting of the electroactive composite film units 36, 38 because of the spring force is thus effectively prevented.

The springs 70, 72 can be formed by moulded springs, disc springs, rubber bands, rubber bodies or other preloading elements, which guarantee a preloading of the film transducer 30, in particular of the electroactive composite film units 36, 38. Other possible preloading elements are, for example, magnetic preloading elements which provide a magnetic preloading of the film transducer 30 or preloading elements which consist of a combination of spring elements and magnetic elements and thus provide a spring-magnetic preloading of the film transducer 30. The magnetic preloading elements are, in particular, formed as permanent-magnet preloading elements.

In general, instead of the two springs 70, 72, a single spring can also be provided which extends, for example, between the two electroactive composite film units 36, 38 from the stationary holding part 40 to the displaceable switch unit 42, in order to mechanically preload the two electroactive composite film units 36, 38 in this way.

The switch unit 42 can be preloaded and movably mounted via the spring system or generally via a preloading system. The two electroactive composite film units 36, 38 likewise engage the switch unit 42.

It further follows from FIG. 1 that the two electroactive composite film units 36, 38 extend predominantly in the y direction, in which the two electroactive composite film units 36, 38 are also preloaded due to the springs 70, 72. The composite film units 36, 38 additionally have an extension in the x direction. The thickness of the two electroactive composite film units 36, 38, which is to be seen in the z direction, i.e. the direction perpendicular to the drawing plane represented, is relatively small in contrast.

The two electroactive composite film units 36, 38 thus each span a plane E, which is defined by the x direction and the y direction, which corresponds to the drawing plane.

To improve the action of the displaceable switch unit 42 serving as valve element, the latter can comprise an in particular flexible membrane 74, which is assigned to the valve seats 22-26, i.e. is formed opposite them on the switch unit 42.

In addition to the membrane 74, the displaceable switch unit 42 can have a base body, which comprises, for example, the clamping points 56, 58 for the second ends 52, 54 of the electroactive composite film units 36, 38, wherein the base body is coupled to the membrane 74.

It is explained below how the film transducer 30 is brought from its opened starting position, which is shown in FIG. 1, into the closed position, which is shown in FIG. 2.

For this purpose, a voltage is applied to the two electroactive composite film units 36, 38 via the voltage source 68 with the result that the composite film units 36, 38 lengthen in an actuation direction B, which is represented correspondingly in FIG. 2. The composite film units 36, 38 therefore convert the electrical energy into mechanical work.

The actuation direction B of the composite film units 36, 38 or of the film transducer 30 corresponds here to the y direction. As already explained, the y direction represents the direction of main extent L of the film transducer 30, in particular of the electroactive composite film units 36, 38.

In this respect, during the actuation of the film transducer 30, in particular of the respective electroactive composite film unit 36, 38, a movement of the film transducer 30 results in the plane E spanned by the film transducer 30, which is also referred to as "in-plane" movement.

The actuation direction B thus coincides with the direction of main extent L of the substantially rectangular and thin (seen in the z direction) film transducer 30, in particular of the respective electroactive composite film units 36, 38, as also follows from FIG. 1, in which the direction of main extent L corresponds to the centre line of the film transducer 30 along its greatest extension.

Through the applied voltage, the two electroactive composite film units 36, 38 thus lengthen in the plane E spanned by the film transducer 30 in the direction L of the displaceable switch unit 42, whereby this is correspondingly displaced into the closed position; due to the spring force of the springs 70, 72.

The flexible membrane 74 of the displaceable switch unit 42 is then supported on the respective valve seats 22-26 with the result that the correspondingly assigned connections 14-18 are closed such that no fluid can flow via the connections 14-18 into the valve 10 or into the collection chamber 43. It is thereby advantageously achieved that the switch unit 42 has no fixed bearing point.

It is also hereby possible that the valve 10 has a good rinsability, since all the valve seats 22-26 can be opened or closed simultaneously.

However, it is also possible that the switch unit 42 has a fixed bearing point. For this purpose, a rocker can be provided which is mounted on a corresponding axle.

In other words, the switch unit 42 has moved linearly.

Figure 3:
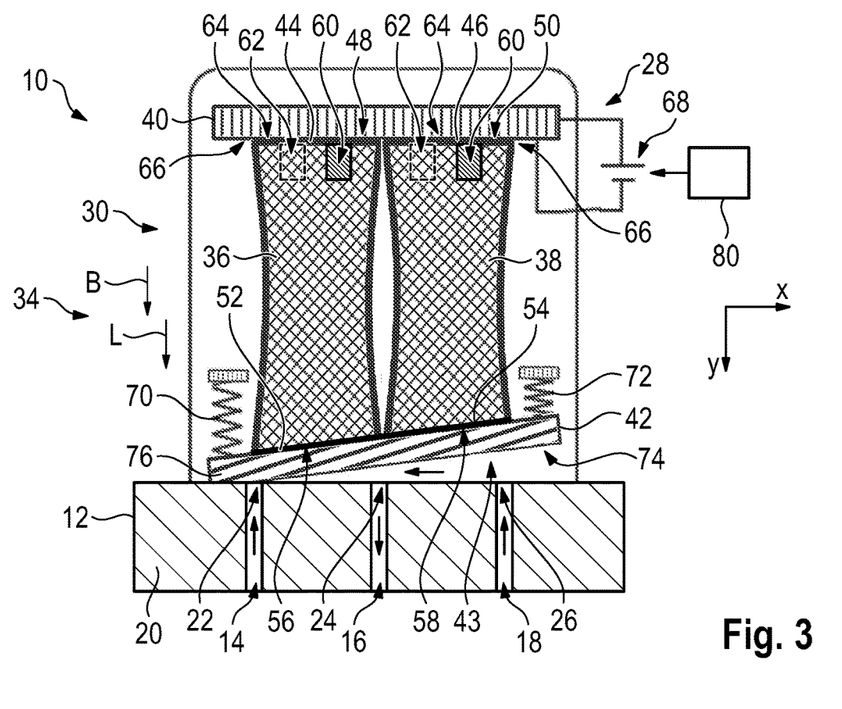
Figure 4:
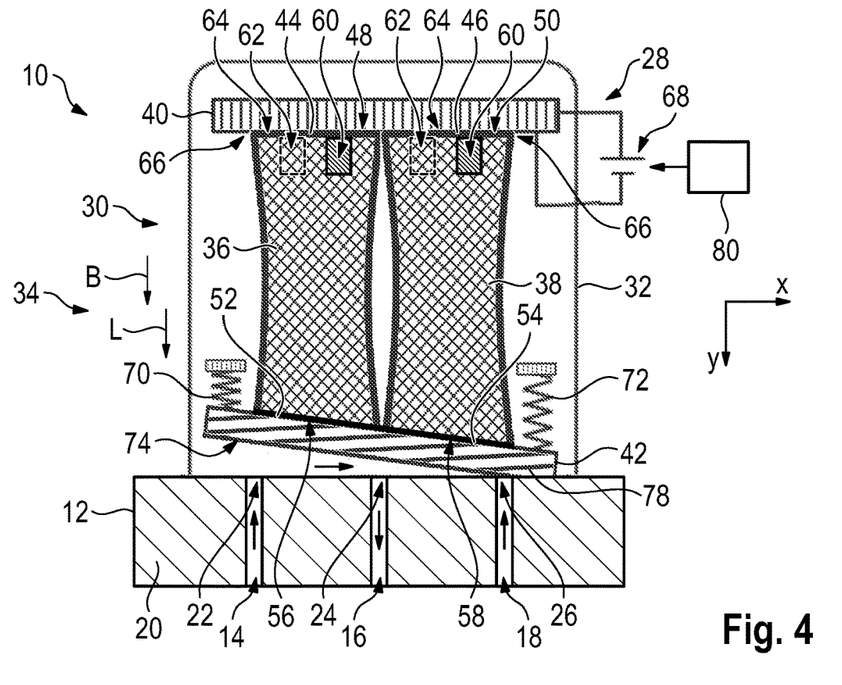

In FIGS. 3 and 4, further switch positions of the valve 10 are shown in which a voltage is only applied to one of the two electroactive composite film units 36, 38 in order to reach the different switch positions of the film transducer 30 or of the valve 10.

It also follows from this that the switch unit 42 is displaceable both linearly and also rotationally since the displaceable switch unit 42 is in the closed position or the open position in sections.

In other words, the switch unit 42 is rotated about a virtual axis of rotation since a voltage is only applied to one of the two electroactive composite film units 36, 38.

In FIG. 3 it is specifically shown that the film transducer 30 is actuated in such a way that exclusively the first electroactive composite film unit 36 is acted on into its closed position, whereby a corresponding first section 76 of the displaceable switch unit 42 closes the first valve seat 22, wherein the second valve seat 24 and the third valve seat 26 are released, with the result that a flow is made possible via these two valve seats 24, 26 or the assigned fluid connections 16, 18, respectively. The third fluid connection 18 can thus serve as a media or fluid inlet and the second fluid connection 16 can serve as a media or fluid outlet, as the flow arrows in FIG. 3 indicate.

Alternatively, the second fluid connection 16 can also serve as a media or fluid inlet whereas the third fluid connection 18 serves as a media or fluid outlet.

In FIG. 4 a second switch position is shown in which a voltage is applied exclusively to the second electroactive composite film unit 38, whereas the first electroactive composite film unit 36 is in its starting position. A second section 78 of the displaceable switch unit 42 is thus in contact with the third valve seat 26 in order to correspondingly close the valve seat 26.

A flow via the first fluid connection 14 to the second fluid connection 16 is hereby possible, as the corresponding flow arrows in FIG. 4 indicate.

Analogously to FIG. 3 it is also possible that the second fluid connection 16 serves as a media or fluid inlet, whereas the fluid or medium flowing in via the second fluid connection 16 is supplied to the first fluid connection 14, which then functions correspondingly as a media or fluid inlet.

Due to the different switch positions which are shown in FIGS. 1 to 4 it becomes clear that the electroactive composite film units 36, 38 can be actuated separately and independently of each other, in that a voltage is correspondingly applied or supplied to the respective electrodes 60, 62 individually and separately from each other. For this purpose, a controller 80 is provided which can be part of the film transducer 30 itself or part of the valve 10.

The controller 80 therefore actuates the corresponding electrical contacts 64, 66 via the voltage source with the result that the electrodes (electrode layers) 60, 62 of the electroactive composite film units 36, 38 are supplied with a voltage and attract each other with the result that the electroactive polymer material lying between them is compressed.

Since the electroactive polymer material is incompressible, the reduction in the thickness (in the z direction) leads to an increase in the length of the respectively actuated electroactive composite film unit 36, 38 in the plane E spanned by the composite film unit 36, 38, which is defined by the x direction and the y direction, which corresponds to the drawing plane.

In particular, the respectively actuated electroactive composite film unit 36, 38 lengthens in the y direction, which is accordingly the actuation direction B of the electroactive composite film units 36, 38 or of the film transducer 30. In this respect, a movement of the film transducer 30, in particular of the correspondingly actuated electroactive composite film unit 36, 38, results in the plane E spanned by the film transducer 30, which is referred to as "in-plane" movement.

The actuation direction B coincides with the direction of main extent L of the substantially rectangular and thin (seen in the z direction) electroactive composite film unit 36, 38, as follows from FIGS. 1 to 4, in which the direction of main extent L corresponds to the centre line of the respective electroactive composite film unit 36, 38 along its greatest extension.

Through the applied voltage, the correspondingly actuated electroactive composite film unit 36, 38 thus lengthens in the plane E spanned by the film transducer 30 in the direction of the switch unit 42. The actuated electroactive composite film unit 36, 38 hereby transfers the switch unit 42 functioning as valve element into one of the switch positions represented in FIGS. 2 to 4 in which the switch unit 42 functioning as valve element is pushed onto the at least one valve seat 22-26 in order to close the assigned fluid connection 14-18 with respect to the collection chamber 43.

In FIG. 2 both composite film units 36, 38 are actuated simultaneously, whereby all the valve seats 22-26 are closed by the membrane 74 of the switch unit 42. In FIGS. 3 and 4 the composite film units 36, 38 are actuated alternately with the result that only the valve seat 22, 26 assigned to the corresponding composite film unit 36, 38 is closed by the membrane 74.

In principle, the composite film units 36, 38 can be actuated separately and independently of each other, whereby it is possible that the switch unit 42 coupled to the composite film units 36, 38 can be linearly displaced (FIGS. 1 and 2) and can be rotated about a (virtual) axis of rotation (FIGS. 3 and 4).

In FIGS. 5 to 8 a pump 82 is shown which comprises a pump housing 84 with a first pump connection 86 and a second pump connection 88, which serve as a fluid or media inlet or a fluid or a media outlet, respectively. The pump connections 86, 88 correspond substantially to the fluid connections 14-18 of the valve 10 shown in FIGS. 1 to 4.

Analogously to the valve 10, the pump 82 has a strip actuator 28, which is formed analogously to the strip actuator 28 of the valve 10.

Because of this the function of the pump 82 and of the valve 10 is also substantially the same.

In this respect, components with the same construction and function are provided with the same reference numbers in the following.

The strip actuator 28 of the pump 82 is likewise formed as a film transducer 30, which thus comprises two electroactive composite film units 36, 38.

As follows from FIGS. 5 to 8 in comparison with FIGS. 1 to 4, the film transducer 30 or the strip actuator 28 can be actuated by the corresponding controller 80 in the same way since the switch positions during operation of the pump 82 correspond to the switch positions of the valve 10. In this respect, reference is made to the above statements.

As already explained above, the displaceable switch unit 42 is formed such that it is at least partially linearly and rotationally displaceable, whereby a rocker function can be provided via the strip actuator 28, in particular via the displaceable switch unit 42.

In this respect, the pump 82 is a rocker pump.

In general, in the case of the film transducer 28, the electroactive composite film units 36, 38 do not have to be clamped to the holding part 40 or the switch unit 42 via their respective ends 44, 46, 52, 54, as is shown in the example of the pump 82. The composite film units 36, 38 can also be coupled to the holding part 40 or the switch unit 42 in a different way.

Figure 8:
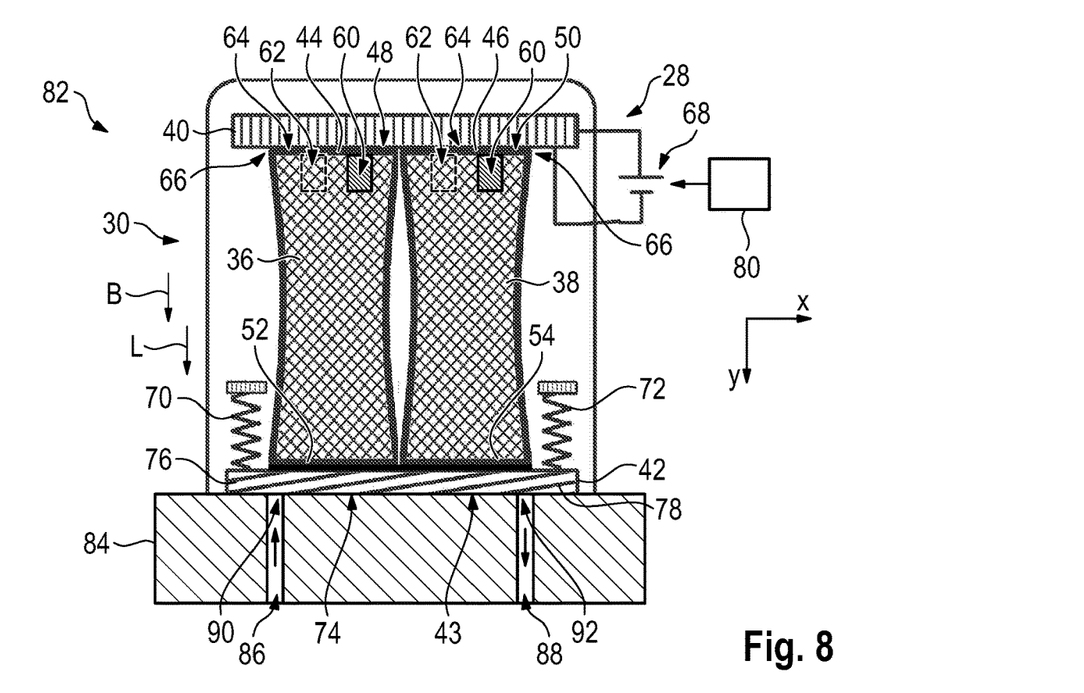

To operate the pump 82, the pump 82, in particular the strip actuator 28, is firstly actuated such that the strip actuator 28 is in the actuated position, i.e. the closed position, which corresponds substantially to the position shown in FIG. 8.

Figure 5:
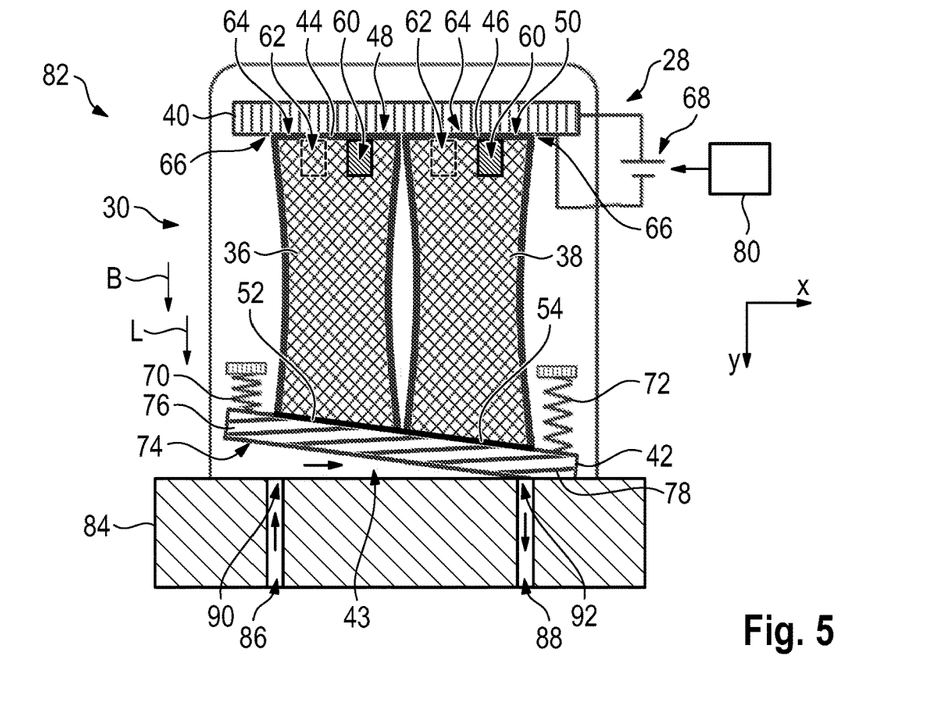

From this closed position, the conveying operation of the pump starts in that the first electroactive composite film unit 36 is actuated such that it is transferred out of its actuated position into its suction position, which corresponds to the starting position of the first electroactive composite film unit 36. Here, the first section 76 of the displaceable switch unit 42 is lifted from the assigned first valve or pump seat 90, whereby a fluid or a medium is sucked in via the first pump connection 86. This corresponds to a suction step, which is shown in FIG. 5.

Figure 6:
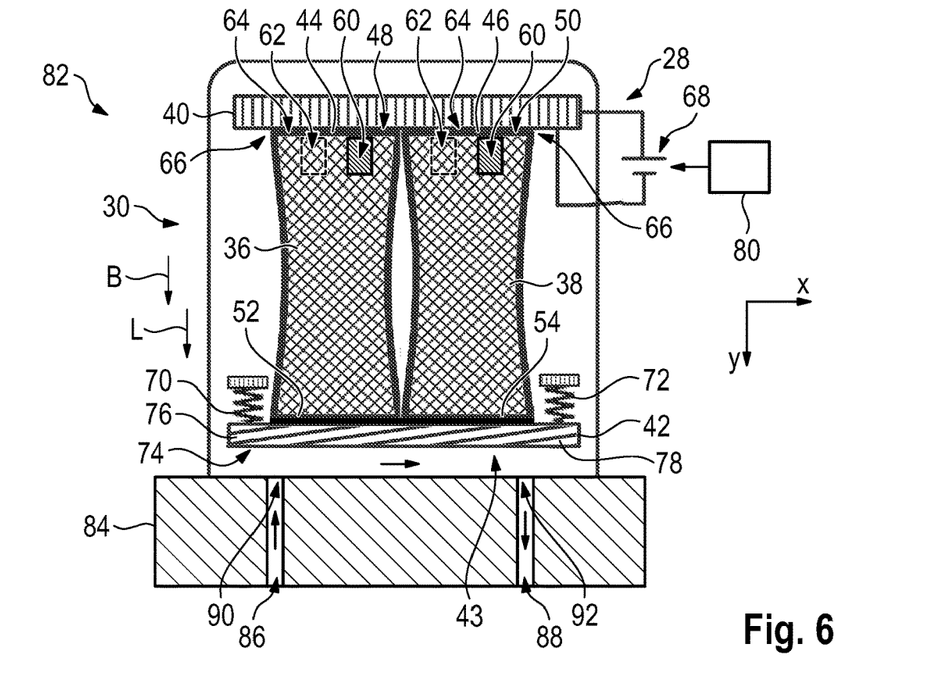

Then, the second electroactive composite film unit 38 is actuated in a first pumping step, shown in FIG. 6, in order to be transferred out of its actuated position into a pumping position. The pumping position corresponds to the starting position of the second electroactive composite film unit 38, with the result that the second section 78 of the switch unit 42 is moved out of an actuated position (see FIG. 5) into the pumping position (see FIG. 6).

The second valve or pump seat 92, which is assigned to the second pump connection 88, is hereby released, whereby a flow connection between the two pump connections 86, 88 is produced, with the result that fluid or medium present at the first pump connection 86 is conveyed to the second pump connection 88.

Figure 7:
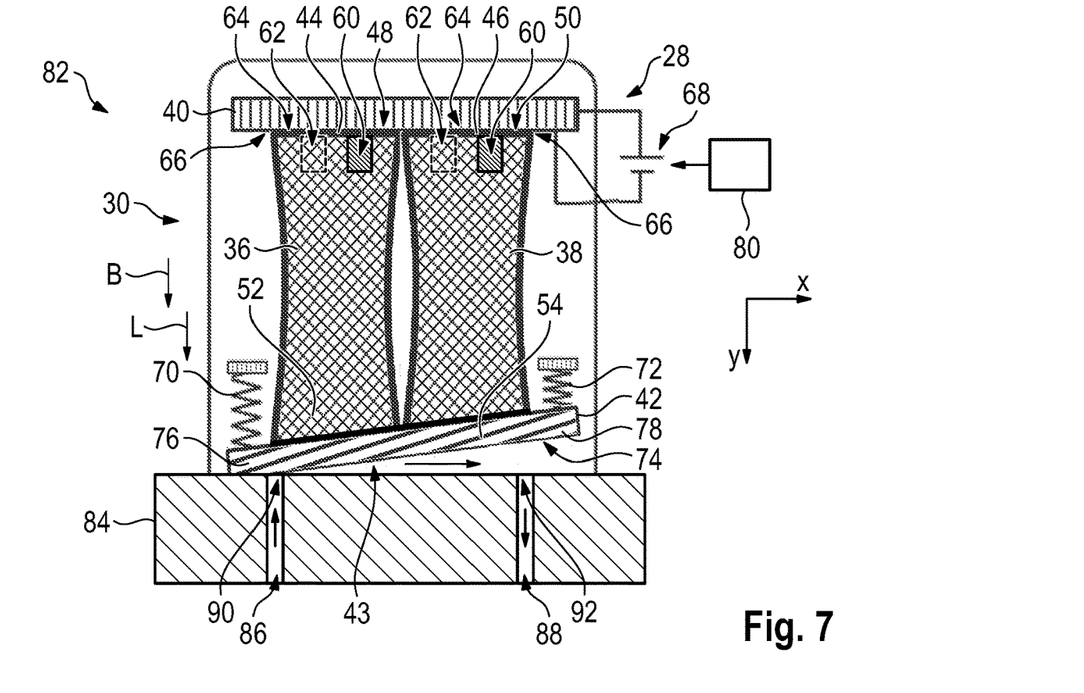

Thereafter, in a second pumping step, a voltage is again applied to the first electroactive composite film unit 36 in order to return it to its actuated position, with the result that the first section 76 of the switch unit 42 likewise returns to an actuated position in which it closes the first valve or pump seat 90, which is assigned to the first pump connection 86. This is shown in FIG. 7.

In this second pumping step it is ensured that the sucked-in fluid or medium, which is located in the collection chamber 43 in the pump 82, is discharged via the second pump connection 88 since the assigned valve or pump seat 92 is still open.

Finally, in a third pumping step (expelling step) corresponding to FIG. 8, the second electroactive composite film unit 38 is again actuated in such a way that a voltage is applied to it in order to return it to its actuated position. It is hereby guaranteed that the second section 78 of the switch unit 42 also again returns into its actuated position, in which the second section 78 comes into contact with the second valve or pump seat 92, in order to correspondingly close it. The previously sucked-in fluid has thus been conveyed entirely via the second pump connection 88.

In this respect, a pump 82, which can convey a fluid in an efficient manner, can be formed simply via the strip actuator 28 formed as a film transducer 30.

Both the valve 10 and the pump 82 are formed particularly narrow since a film transducer 30, which has a so-called "in-plane" movement, is used as strip actuator 28 in each case, whereby a very small volume is required even during operation of the strip actuator 28.

The valve 10 or the pump 82 can thus be used in poorly accessible locations, in particular in locations which have a small construction space.

Several valves 10 or several pumps 82 can also be used in series in this way in the narrowest space since they each require a small construction space.

Due to the EAP actuator, which is formed as an "in-plane" strip actuator 28, an energy-efficient valve 10 or a correspondingly energy-efficient pump 82 is also provided.

In general, the electroactive composite film units 36, 38 can be formed by a multi-ply composite film (stack) which comprises several films made of an electroactive polymer material. The individual films are separated from each other by electrodes 60, 62, the polarity of which alternates in each case, with the result that each film of the multi-ply composite film is bounded by two different electrodes 60, 62, in particular over the whole surface.

The respective electrodes 60, 62 thus lie against opposite sides of each film, as is likewise the case in the electroactive composite film units 36, 38 with only one film.

The several films can in each case be contacted through at a corresponding front face of the composite film unit 36, 38 such that all the electrodes 60, 62 with the same polarity are contacted by only one assigned contact 64, 66, which has the corresponding polarity.

The invention claimed is:

1. A film transducer for a pump, comprising at least one holding part arranged fixed, a displaceable switch unit and at least two electroactive composite film units, which each have at least two electrodes, wherein the electroactive composite film units are each assigned to the holding part and the switch unit, and wherein the electroactive composite film units have an actuation direction in which the electroactive composite film units lengthen when actuated, wherein the actuation direction lies in a plane spanned by the electroactive composite film units, wherein in each case one end of the electroactive composite film units is coupled to the switch unit, which does not have a fixed bearing point, and wherein a controller is provided which is configured to actuate the electroactive composite film units separately and independently of each other.

2. The film transducer according to claim 1, characterized in that the electrodes are arranged on opposite sides of the respective electroactive composite film unit.

3. The film transducer according to claim 2, characterized in that the electrodes extend over the entire surface of the respective side.

4. The film transducer according to claim 1, characterized in that the film transducer has a direction of main extent which coincides with the actuation direction.

5. The film transducer according to claim 1, characterized in that in each case a first end of the electroactive composite film unit is held on the holding part.

6. The film transducer according to claim 5, characterized in that in each case a first end of the electroactive composite film unit is clamped to the holding part and/or in that in each case a second end of the electroactive composite film unit, opposite the first end, is clamped to the switch unit.

7. The film transducer according to claim 1, characterized in that the film transducer has electrical contacts for the electrical contacting of the electrodes.

8. The film transducer according to claim 1, characterized in that the switch unit comprises at least one membrane.

9. The film transducer according to claim 1, characterized in that at least one spring co-operates with the switch unit in order to mechanically preload the electroactive composite film units.

10. The film transducer according to claim 1, characterized in that two springs co-operate with the switch unit, which engage opposite ends of the switch unit in relation to the electroactive composite film units.

11. A pump with a pump housing, which comprises at least two connections, and a strip actuator, characterized in that the strip actuator is formed as a film transducer according to claim 1.

12. A method for operating a pump, with the following steps:
    actuating a first electroactive composite film unit of the pump in a suction step such that a movement of a first section of a switch unit out of its actuated position into a suction position is effected,
    actuating a second electroactive composite film unit of the pump in a first pumping step such that a movement of a second section of the switch unit out of its actuated position into a pumping position is effected,
    actuating the first electroactive composite film unit in a second pumping step such that the first section of the switch unit returns to its actuated position, and
    actuating the second electroactive composite film unit in an expelling step such that the second section of the switch unit returns to its actuated position.

* * * * *